(12) United States Patent
Chu et al.

(10) Patent No.: US 12,016,168 B2
(45) Date of Patent: Jun. 18, 2024

(54) WEB FOR ABSORBING ELECTROMAGNETIC WAVE AND HOUSING OF ELECTRONIC PARTS USING THE SAME

(71) Applicant: HYUNDAI MOTOR COMPANY, Seoul (KR)

(72) Inventors: In Chang Chu, Seoul (KR); Jin Woo Kwak, Gyeongsan-Si (KR)

(73) Assignee: Hyundai Motor Company, Seoul (KR)

( * ) Notice: Subject to any disclaimer, the term of this patent is extended or adjusted under 35 U.S.C. 154(b) by 1046 days.

(21) Appl. No.: 14/468,012

(22) Filed: Aug. 25, 2014

(65) Prior Publication Data

US 2015/0181775 A1 Jun. 25, 2015

(30) Foreign Application Priority Data

Dec. 19, 2013 (KR) .......... 10-2013-0158986

(51) Int. Cl.
*H05K 9/00* (2006.01)
*H05K 5/03* (2006.01)
(52) U.S. Cl.
CPC .............. *H05K 9/009* (2013.01); *H05K 5/03* (2013.01); *Y10T 442/10* (2015.04)
(58) Field of Classification Search
CPC ......... H05K 9/009; H05K 5/03; Y10T 442/10
See application file for complete search history.

(56) References Cited

U.S. PATENT DOCUMENTS

| 6,265,466 B1 | 7/2001 | Glatkowski et al. |
| 2009/0176112 A1 | 7/2009 | Kruckenberg et al. |
| 2012/0040581 A1 * | 2/2012 | Kim ................ C04B 35/62218 442/330 |
| 2012/0270069 A1 | 10/2012 | Chang et al. |
| 2013/0050113 A1 | 2/2013 | Brown |

FOREIGN PATENT DOCUMENTS

| JP | 60257240 A * | 12/1985 |
| JP | 10-0564774 B1 | 3/2006 |
| KR | 10-2011-0113999 A | 10/2011 |
| WO | 2012/153063 A1 | 11/2012 |
| WO | 2013/010962 A1 | 1/2013 |
| WO | 2013/183887 A1 | 12/2013 |

* cited by examiner

*Primary Examiner* — Elizabeth M Imani
(74) *Attorney, Agent, or Firm* — Morgan, Lewis & Bockius LLP

(57) ABSTRACT

An electromagnetic wave-absorbing web for controlling interference by electromagnetic wave at a low frequency band generated from various electric and electronic parts and for securing strength without added material and achieving lightweight is provided. The web is manufactured of a mixture solution in the form of a fabric having a mesh structure, wherein the mixture solution is made by mixing a conductive nanomaterial, a magnetic nanofiller, a binder, and a solvent.

12 Claims, 4 Drawing Sheets

WEB FOR ABSORBING ELECTROMAGNETIC WAVE AND HOUSING OF ELECTRONIC PARTS USING THE SAME

CROSS-REFERENCE TO RELATED APPLICATION

This application claims under 35 U.S.C. § 119(a) the benefit of priority to Korean Patent Application No. 10-2013-0158986 filed on Dec. 19, 2013, the entire contents of which are incorporated herein by reference.

TECHNICAL FIELD

The present disclosure relates to a web for absorbing electromagnetic wave for a control of electronic wave at a low frequency band and applicable to various electric and electronic parts.

BACKGROUND

Recently, with an increase of electric and electronic parts in a vehicle and requirements for high density integrity thereof, the importance of light weight, stability, and interference by electronic waves has been emphasized. Since a most electromagnetic wave-absorbing product currently used is an absorbing sheet usable at high frequency band and has a filling factor of 80% or more, the sheet is heavy and is difficult to use at a low frequency band. Thus, the electromagnetic wave interference according to the related art is controlled by sealing a housing of the electronic parts by focusing on shield by reflection of electromagnetic waves.

However, the existing sheet using the sealing has a high damping intensity of electromagnetic waves even in the metal housing based on the electromagnetic wave reflection, a potential problem causing a mutual interference by electromagnetic wave successively, and potential risk exposed to a secondary noise. Moreover, since a metal is used as a shield material for the electromagnetic waves, it is difficult to reduce weight and disadvantageous in fuel ratio.

In a case where plastic is used as the electromagnetic wave shielding material in order to solve the problem, glass fiber is added to polybutylene terephthalate (PBT) resin to obtain withstand voltage, heat resistance, etc. However, this material has a limit to be applied to an electronic control unit and electronic parts of a vehicle because of lack of electromagnetic wave control characteristic.

In addition, the existing electromagnetic wave-absorbing material is disadvantageous in strength. Thus, to be used in the housing for electronic parts, ceramic fiber, glass fiber, and the like should be added to maintain material property.

In general, commercial products have been already developed to absorb electromagnetic waves at high frequency band higher than 1 GHz, but not yet at a low frequency band.

SUMMARY

The present disclosure provides an electromagnetic wave-absorbing web for controlling interference by electromagnetic wave at a low frequency band generated from various electric and electronic parts and for securing strength without added material and achieving light weight.

In accordance with an exemplary embodiment of the present disclosure, a web for absorbing electromagnetic wave manufactured of a mixture solution in the form of a fabric having a mesh structure is provided. The mixture solution is made by mixing a conductive nanomaterial, a magnetic nanofiller, a binder, and a solvent.

The conductive nanomaterial may be one or more selected from a group of a ceramic bead, a ceramic fiber, a carbon nanotube, and a graphite nanoplate.

The magnetic nanofiller may be a magnetic metal having magnetic permeability different from that of the conductive nanomaterial.

The binder may be one or more selected from a group of polyester, acryl, polyvinyl chloride (PVC), polyurethane, polypropylene, polyethylene, epoxy, polyamide, and nylon.

The solvent may be one or more selected from a group of water, halogenated hydrocarbon, alcohol, ester, ketone, and ether.

The fabric is manufactured by one selected from a group of melt blown, spun bond, and electro spun web.

According to another exemplary embodiment of the present disclosure, a method of manufacturing an electromagnetic wave-absorbing web is provided. A mixture solution is obtained by stirring and mixing evenly and poured into an injection mold through a hopper.

The method may further include feeding the mixture solution to a filter by a metering pump, feeding to a die, and then feeding to a collection drum. The mixture solution may be spun in an air jet by a spinneret of the die, which is guided by airflow from outside the spinneret.

The spinneret may spin a plurality of superfine fibers and a web which is formed on the collection drum.

The method may further comprise transferring the web to be wound around a winder.

The mixture solution may be spun in an air jet form by a spinneret of the injection mold. The spinneret may spin a plurality of superfine fibers which are collected in an attenuator to spin a conveyor and are bonded to a calendar for heat bonding.

According to another exemplary embodiment of the present disclosure, a method of manufacturing an electromagnetic wave-absorbing web is provided. The mixture solution is obtained by stirring and mixing evenly and poured into a capillary tube. The mixture solution is then spun from a Taylor cone at a lower end of the capillary tube to a collector by an external high voltage supply.

The electromagnetic wave-absorbing web according to the present disclosure is made using electromagnetic wave-absorbing mixture solution in the form of a mesh such as nonwoven fabric, absorbs electromagnetic waves at a low frequency band, and has an ability of shielding electromagnetic waves due to structural property, thus maximizing performance of controlling the electromagnetic waves.

Moreover, the web may be used as a material for a housing of various electric and electronic parts by coating with plastic and its strength can be maximized without added glass fiber, ceramic fiber, etc., which are used in the existing web for the strength.

Thus, the web according to the present disclosure can maintain a safe status of the electric and electronic parts from the interferences of the electromagnetic waves and secure excellent durability.

BRIEF DESCRIPTION OF THE DRAWINGS

The above and other features of the present disclosure will now be described in detail with reference to certain exemplary embodiments thereof illustrated by the accompanying drawings which are given hereinbelow by way of illustration only, and thus are not limitative of the present disclosure.

Figure 1:
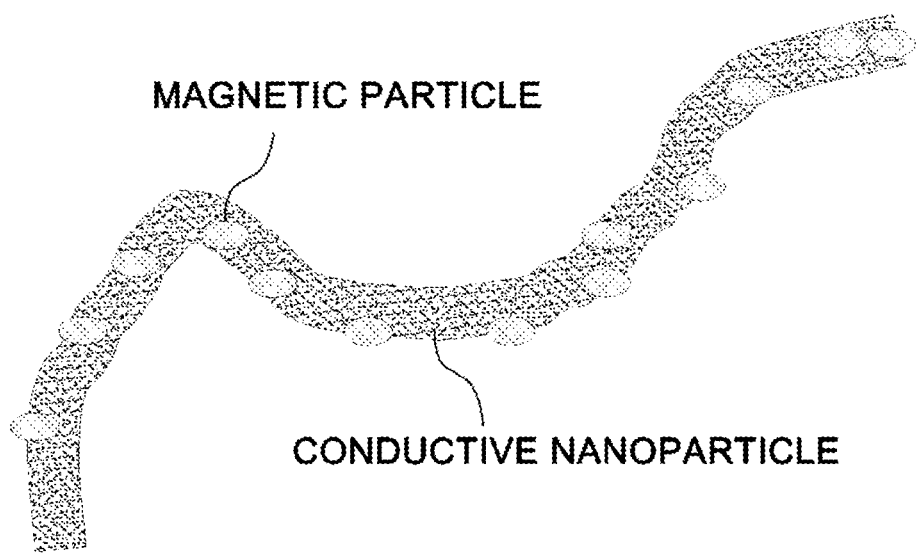
FIG. 1 is a schematic view illustrating fiver forming a web for absorbing electromagnetic wave according to an embodiment of the present disclosure.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

Hereinafter, exemplary embodiments of the present disclosure will be described in detail with reference to the accompanying drawings.

The present disclosure relates to an electromagnetic wave-absorbing web optimized to be applied to electric and electronic parts of a vehicle for the use at a low frequency band. The electromagnetic wave-absorbing web according to the present disclosure may control interference by the electromagnetic wave generated from various electronic control units of environment-friendly vehicle and the electric and electronic parts of a common vehicle, has durability exceeding durability of ceramic materials such as ferrite used to absorb the electromagnetic wave at the low frequency band, and may be made with light weight.

The electromagnetic wave-absorbing web according to an embodiment of the present disclosure is manufactured in the form of a web or fabric such as nonwoven fabric simultaneously with manufacturing superfine fibers forming the web and may be manufactured of thermosetting, thermoplastic, and polymer materials as raw material for the web (later-described mixture solution). If the electromagnetic wave-absorbing web is coated with plastic, the web may be used as a material for a housing of electric parts. In this case, strength of the web can be maximized without adding glass fiber, ceramic fiber, and the like for a supplement strength.

The electromagnetic wave-absorbing web according to an embodiment of the present disclosure, as illustrated in FIG. 1, has a web structure based on superfine fiber and a mixture solution containing conductive nanomaterial, and magnetic nanofiller is used as a raw material for the web. The electromagnetic wave-absorbing web is manufactured of the conductive nanomaterial as a basic matrix so that an electromagnetic wave reflection can be improved for shielding against the electromagnetic wave, and some of the electromagnetic wave is transformed into heat to absorb the electromagnetic wave. The conductive nanomaterial contains a magnetic metal nanowire or magnetic metal particles as a filler so that the characteristic of absorbing the electromagnetic wave is increased.

That is, the electromagnetic wave-absorbing web according to an embodiment of the present disclosure is manufactured of a composition (or a mixture solution) containing the conductive nanomaterial and the magnetic metal nanowire; the conductive nanomaterial and the magnetic metal particles; or the connective nanomaterial, the magnetic metal nanowire, and the conductive metal particles.

The electromagnetic wave-absorbing web is manufactured of composition based on the conductive nanomaterial added by the magnetic metal nanowire or the magnetic metal particles having a different magnetic permeability so that the characteristic of absorbing electromagnetic wave at a low frequency band. Magnetic metals with the different magnetic permeability are added in the form of the nanowire or the magnetic metal particles, so that the electromagnetic absorbing band may be shifted to the low frequency band or a high frequency band. Thus, the web is advantageous in shielding the electromagnetic waves at a target frequency band.

If a magnetic metal in the form of nanowire or particles is added to the conductive nanomaterial, the magnetic metal (magnetic nanofiller) can be filled in gaps of the conductive nanomaterial so that a filling factor of the whole functional materials can be increased, and the shield effect against the electromagnetic waves can be maximized. In more detail, the mixture solution used as a raw material in manufacturing the electromagnetic wave-absorbing web according to an embodiment of the present disclosure is made by mixing the conductive nanomaterial, the magnetic nanofiller, a binder, and a solvent.

Here, the conductive nanomaterial may be ceramic beads, ceramic fibers, carbon nanotubes, graphite nanoplate, and one or more selected from the same. The nanofiller may be the magnetic metal with the magnetic permeability different from that of the conductive nanomaterial such as one or more selected from the magnetic metal nanowires and the magnetic metal particles. The binder may be polyester, acryl, polyvinyl chloride (PVC), polyurethane, polypropylene, polyethylene, epoxy, polyamide, nylon, and one or more selected from the same. The solvent may be water, halogenated hydrocarbon, alcohol, ester, ketone, ether, and one or more selected from the same.

The electromagnetic wave-absorbing web according to an embodiment of the present disclosure is manufactured of the mixture solution as described above in the form of nonwoven fabric. The web has a tissue such as yarn (fiber) as illustrated in FIG. 1 having a specific shape, and is easily used to manufacture a housing for electric and electronic parts. For example, the housing for electric and electronic parts may be manufactured with a panel in which one or both sides of the electromagnetic wave-absorbing web according to an embodiment of the present disclosure coated with plastic.

Moreover, the electromagnetic wave-absorbing web according to an embodiment of the present disclosure may exhibit electromagnetic wave-shield characteristic of a metal mesh when the web is manufactured in the form of fabric having a mesh structured during the manufacturing process. Thus, the electromagnetic wave-absorbing web according to an embodiment of the present disclosure achieves the electromagnetic shield characteristic of the conductive mesh and the electromagnetic wave-absorbing characteristic of the magnetic metal, so that the characteristic of controlling the electromagnetic wave can be maximized.

The electromagnetic wave-absorbing may be manufactured by a manufacturing process such as melt blown, spun bond, and electro spun web. Since the manufacturing process is already known in the art, such as nonwoven fabric, its detailed description will be omitted but brief description will be followed with reference to FIGS. 2 to 4.

First, a manufacturing process using the melt blown is described.

Figure 2:
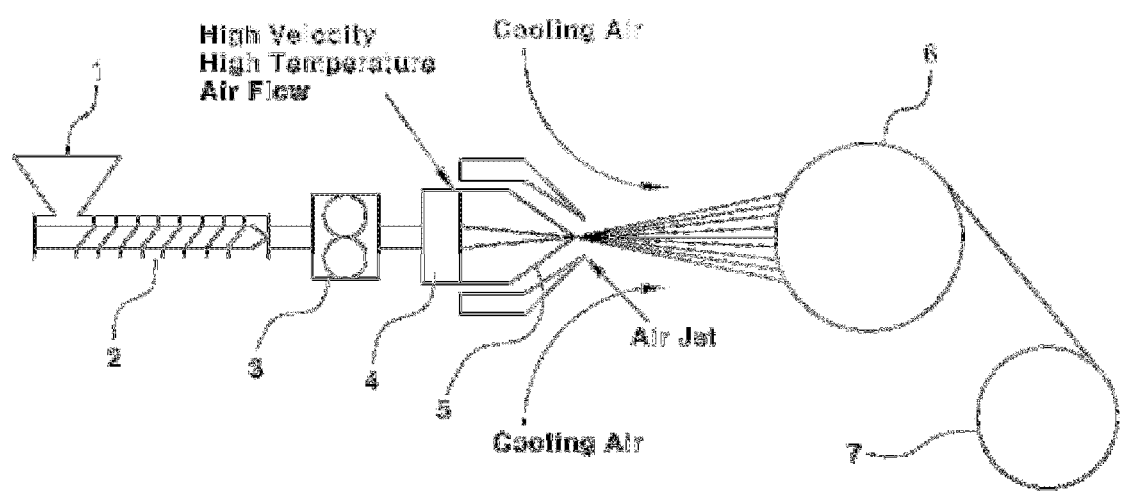
FIGS. 2 to 4 are schematic diagrams illustrating a method of manufacturing an electromagnetic wave-absorbing web according to an embodiment of the present disclosure.

Referring to FIG. 2, the above-mentioned mixture solution is obtained by stirring and mixing evenly and is poured into an injection mold 2 through a hopper 1. The mixture solution, which is evenly mixed in the injection mold 2, is fed to a filter 4 by a metering pump 3, passes through the filter 4, and is fed to a die 5 having a spinneret. The mixture solution fed to the die 5 is spun in an air jet through the spinneret, wherein the mixture solution is guided by airflow of high speed and high temperature formed outside the spinneret and introduced to a collection drum 6, and at this time is cooled by external cooling air.

In this case, the spinneret spins a plurality of superfine fibers simultaneously and a web such as nonwoven fabric is formed on the collection drum 6. The web, which is spun and formed on the collection drum 6, is transferred to and wound around a winder 7.

Next, the web manufacturing process using the spun bond is described.

Figure 3:
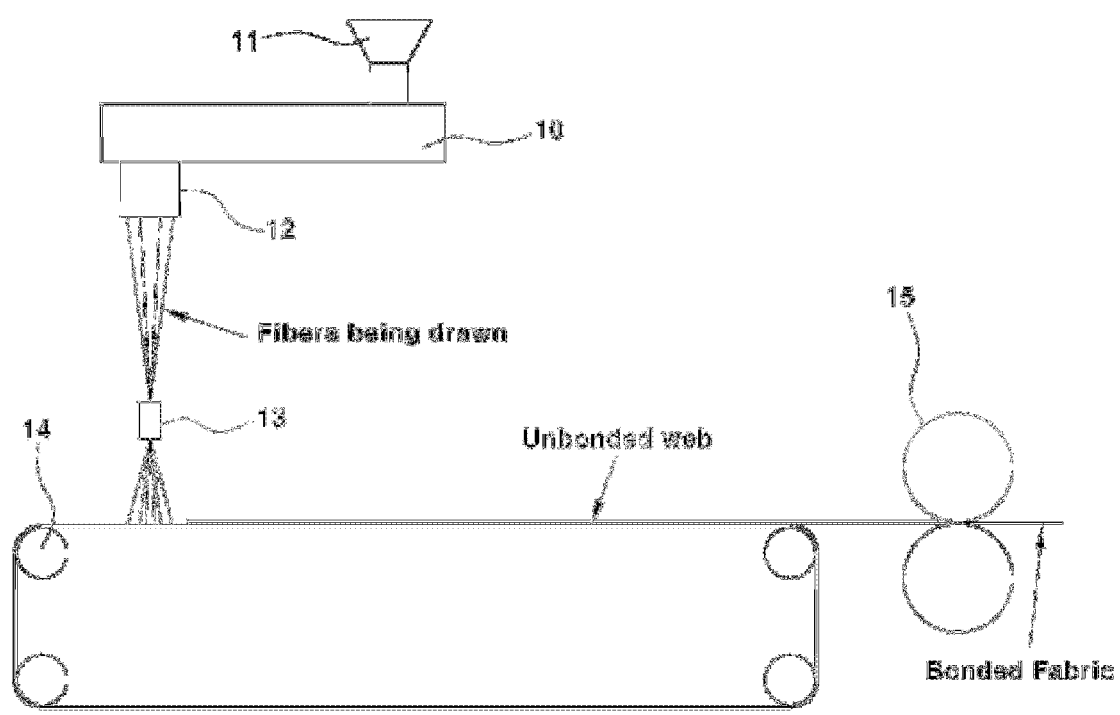

Referring to FIG. 3, the above-mentioned mixture solution is obtained by evenly stirring and mixing and is poured into an injection mold 10 through a hopper 11. The mixture solution evenly mixed in the injection mold 10 is spun in the form of an air jet through the spinneret of the injection mold 10, wherein a spinneret 12 spins a plurality of superfine fibers at the same time. The fibers spun by the spinneret 12 are collected in an attenuator 13 which spins a conveyor 14 and is bonded chemically and mechanically to a calendar 15 for heat bonding, resulting in a web such as bonded fabric.

The web manufacturing process using the electro spun web is described.

Figure 4:
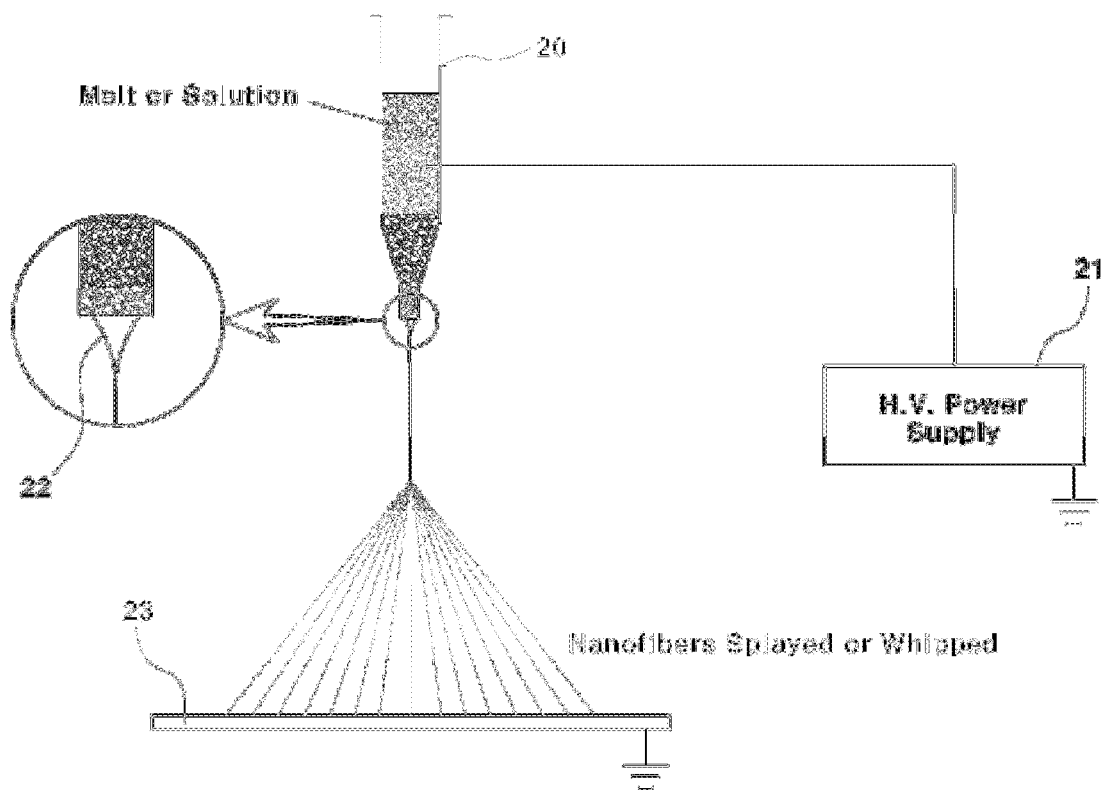

Referring to FIG. 4, the above-mentioned mixture solution is obtained by stirring and mixing evenly and is poured into a capillary tube 20. The mixture solution poured into the capillary tube 20 is spun from a Taylor cone 22 at the lower end of the capillary tube 20 to a collector 23 by a high voltage supplied by an external high voltage supply 21 to manufacture a web. The mixture solution remains in the melt state or as a solution in the capillary tube 20.

The electromagnetic wave-absorbing web according to an embodiment of the present disclosure is advantageous in comparison to the existing web as follows:

1) Since the magnetic nanowires or particles are added to the conductive nanomaterial basis, light weight and corrosion resistant can be improved in comparison to the conventional metal materials;
2) Since the magnetic nanowires or particles are added into gaps of a conductive nanomaterial, porosity of the material is reduced so that a fill factor of a functional material can be increased and shield effect for the electromagnetic wave is improved, and a small volume brings improved formability when the web is applied to parts;
3) Since the magnetic nanowires or particles with various magnetic permeability are used, a characteristic absorbing the electromagnetic wave at a low frequency band can be improved and a shield effect can be controlled at a specific frequency band;
4) Since the conductive nanomaterial (conductive nanowires) are bonded to the magnetic nanofiller (magnetic nanowires), the same strength as in adding glass fiber to the existing electromagnetic wave-absorbing material can be exhibited;
5) If thermosetting and thermoplastic materials are used, strength can be improved without depending on the ceramic fiber, glass fiber, and the like, and the electromagnetic waves can be controlled;
6) The size of fiber forming the web can be adjusted for the use when a nozzle jetting the mixture solution is adjusted in size;
7) Since the web is manufactured in the form of a mesh such as nonwoven fabric, the web itself can achieve the electromagnetic wave-shield characteristic like in the metal mesh and maximized control performance for the electromagnetic waves;
8) If the web is used with plastic, the web is easily applied to manufacture parts such as a housing for electric and electronic parts; and
9) Since the web contains material absorbing the electromagnetic waves, secondary noise can be prevented from being generated.

The disclosure has been described in detail with reference to exemplary embodiments thereof. However, it will be appreciated by those skilled in the art that changes may be made in these embodiments without departing from the principles and spirit of the disclosure, the scope of which is defined in the appended claims and their equivalents.

What is claimed is:

1. A web for absorbing an electromagnetic wave manufactured of a mixture solution in the form of a fabric having a mesh structure,
   wherein the mixture solution is a mixture of a conductive nanomaterial, a magnetic nanofiller, a binder, and a solvent,
   wherein the magnetic nanofiller comprises a magnetic metal having a magnetic permeability different from that of the conductive nanomaterial, and
   wherein the magnetic metal is in the form of nanowire or particles and filled in gaps of the conductive nanomaterial, and wherein the web has a yarn-shape and the mesh structure is formed within the yarn-shaped web.

2. The web of claim 1, wherein the binder comprises one or more selected from a group of polyester, acryl, polyvinyl chloride (PVC), polyurethane, polypropylene, polyethylene, epoxy, polyamide, and nylon.

3. The web of claim 1, wherein the solvent comprises one or more selected from a group of water, halogenated hydrocarbon, alcohol, ester, ketone, and ether.

4. The web of claim 1, wherein the fabric is made of one selected from a group of melt blown, spun bond, and electro spun web.

5. A housing for an electric part manufactured using a panel which is manufactured by coating plastic on one side or both sides of the web for absorbing the electromagnetic wave of claim 1.

6. A housing for an electric part manufactured using a panel which is manufactured by coating plastic on one side or both sides of the web for absorbing the electromagnetic wave of claim 1.

7. A housing for an electric part manufactured using a panel which is manufactured by coating plastic on one side or both sides of the web for absorbing the electromagnetic wave of claim 2.

8. A housing for an electric part manufactured using a panel which is manufactured by coating plastic on one side or both sides of the web for absorbing the electromagnetic wave of claim 3.

9. A housing for an electric part manufactured using a panel which is manufactured by coating plastic on one side or both sides of the web for absorbing the electromagnetic wave of claim 4.

10. A web for absorbing an electromagnetic wave manufactured of a mixture solution in the form of a fabric having a mesh structure, wherein the mixture solution is a mixture of a conductive nanomaterial, a magnetic nanofiller, a binder, and a solvent, and wherein the web has a yarn-shaped tissue, wherein the magnetic nanofiller comprises a magnetic metal having a magnetic permeability different from that of the conductive nanomaterial, and wherein the magnetic metal is in the form of nanowire or particles and filled in gaps of the conductive nanomaterial such that a filling factor of the whole functional materials is increased, and the shield effect against the electromagnetic waves is increased.

11. The web of claim 10, wherein the conductive nanomaterial comprises one or more selected from the group consisting of a ceramic bead, a ceramic fiber, a carbon nanotube, and a graphite nanoplate.

12. The web of claim 1, wherein the conductive nanomaterial comprises one or more selected from the group consisting of a ceramic bead, a ceramic fiber, a carbon nanotube, and a graphite nanoplate.

* * * * *